United States Patent
Feng

(10) Patent No.: US 11,181,942 B1
(45) Date of Patent: Nov. 23, 2021

(54) FOLDABLE DISPLAY DEVICE

(71) Applicant: Wuhan China Star Optoelectronics Semiconductor Display Technology Co., Ltd., Hubei (CN)

(72) Inventor: Zikang Feng, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/965,646

(22) PCT Filed: Jul. 22, 2020

(86) PCT No.: PCT/CN2020/103474
§ 371 (c)(1),
(2) Date: Jul. 29, 2020

(51) Int. Cl.
*G06F 1/16* (2006.01)
*H01L 51/52* (2006.01)

(52) U.S. Cl.
CPC .......... *G06F 1/1616* (2013.01); *G06F 1/1652* (2013.01); *G06F 1/1656* (2013.01); *G06F 1/1686* (2013.01); *H01L 51/52* (2013.01); H01L 2251/5338 (2013.01)

(58) Field of Classification Search
CPC .... G06F 1/1616; G06F 1/1652; G06F 1/1656; G06F 1/1686; H01L 51/52; H01L 2251/5338
See application file for complete search history.

(56) References Cited

U.S. PATENT DOCUMENTS

| | | | |
|---|---|---|---|
| 6,377,324 B1* | 4/2002 | Katsura | G02F 1/133305 349/58 |
| 9,204,565 B1 | 12/2015 | Lee et al. | |
| 9,826,626 B2 | 11/2017 | Myeong et al. | |
| 10,180,704 B1* | 1/2019 | Stewart | G06F 1/1681 |
| 10,244,088 B2* | 3/2019 | Kikuchi | G09G 3/3208 |
| 10,488,887 B2* | 11/2019 | Yamazaki | F16M 13/00 |
| 10,716,228 B2* | 7/2020 | You | H05K 5/0086 |
| 10,831,243 B2* | 11/2020 | Kim | G06F 1/1641 |
| 10,928,863 B2* | 2/2021 | Pelissier | G06F 1/1637 |
| 11,044,825 B1* | 6/2021 | Han | H05K 5/0226 |
| 2012/0236484 A1* | 9/2012 | Miyake | G06F 1/1616 361/679.01 |
| 2013/0021762 A1* | 1/2013 | Dijk | H04M 1/022 361/749 |
| 2014/0111954 A1* | 4/2014 | Lee | G06F 1/1652 361/749 |

(Continued)

FOREIGN PATENT DOCUMENTS

| | | |
|---|---|---|
| CN | 103914273 | 7/2014 |
| CN | 106205384 | 12/2016 |

(Continued)

*Primary Examiner* — Abhishek M Rathod

(57) ABSTRACT

A foldable display device is provided, which includes a first rear housing and a second rear housing, a connection member, four slider members fixedly connected inside the first rear housing and the second rear housing, a support plate including a first support plate and a second support plate which are arranged inside the first rear housing and the second rear housing and fixedly connected to the corresponding slider members, and a front frame; wherein when in a folded state, a non-bending region of a flexible display screen is inclined at an angle relative to a housing of the display device.

17 Claims, 2 Drawing Sheets

(56) References Cited

U.S. PATENT DOCUMENTS

| | | | | |
|---|---|---|---|---|
| 2014/0211108 A1* | 7/2014 | Matsumoto | ............ | G06F 1/1632 |
| | | | | 349/12 |
| 2014/0355181 A1* | 12/2014 | Jung | ................ | G02F 1/133305 |
| | | | | 361/679.01 |
| 2015/0330614 A1* | 11/2015 | Lee | ........................ | B65D 85/38 |
| | | | | 362/97.1 |
| 2015/0366089 A1* | 12/2015 | Park | ...................... | G06F 1/1641 |
| | | | | 361/679.01 |
| 2015/0370287 A1* | 12/2015 | Ko | ........................ | G06F 1/1626 |
| | | | | 361/749 |
| 2016/0139634 A1* | 5/2016 | Cho | ...................... | G06F 1/1652 |
| | | | | 361/679.27 |
| 2016/0295709 A1* | 10/2016 | Ahn | ...................... | H05K 5/0226 |
| 2016/0324023 A1* | 11/2016 | Kim | ...................... | G06F 1/1677 |
| 2017/0069299 A1* | 3/2017 | Kwak | ...................... | G06F 3/147 |
| 2020/0103935 A1* | 4/2020 | Hsu | ........................ | G06F 1/1681 |
| 2021/0195776 A1* | 6/2021 | Feng | .................... | H05K 5/0226 |

FOREIGN PATENT DOCUMENTS

| | | |
|---|---|---|
| CN | 109461383 | 3/2019 |
| CN | 110767087 | 2/2020 |
| CN | 111091758 | 5/2020 |
| CN | 111128016 | 5/2020 |

\* cited by examiner

FOLDABLE DISPLAY DEVICE

RELATED APPLICATIONS

This application is a National Phase of PCT Patent Application No. PCT/CN2020/103474 having International filing date of Jul. 22, 2020, which claims the benefit of priority of Chinese Patent Application No. 202010573541.9 filed on Jun. 22, 2020. The contents of the above applications are all incorporated by reference as if fully set forth herein in their entirety.

FIELD AND BACKGROUND OF THE INVENTION

The present application relates to the field of display technologies, and specifically to a foldable display device.

With development of flexible display technologies, foldable or rollable display devices have become an extremely important development direction in future display technology. Because flexible display screens have advantages of light weight-ness and thinness, durability, bendability, foldability, and wearability, they can be used in bendable and deformable electronic products, such as smart watches, smart phones, car displays, and smart display terminals.

In the foldable display devices, a folding method is divided into inner folding and outer folding. However, in the inner folding display devices, a size of an inner surface is reduced after the devices are bent, resulting in a size mismatch of the flexible display screens. A special structure is provided to accommodate an "excess" region of the flexible display screens formed after folding, but the special structure occupies too much space, so that there is insufficient space place a system motherboard, a battery, and other components.

SUMMARY OF THE INVENTION

Technical Problem

The present application provides a foldable display device, which can provide enough space to accommodate an "excess" region of a flexible display screen formed by bending when folded, without taking up too much internal space of an entire machine, and it can make storage space for components such as system boards and batteries.

Technical Solution

In order to solve the above problems, in a first aspect, the present invention provides a foldable display device including:

a rear housing including a first rear housing and a second rear housing;

a connection member connected to the first rear housing and the second rear housing, wherein the first rear housing and the second rear housing are connected by the connection member, and the first rear housing and the second rear housing rotate about the connection member as an axis;

four slider members, wherein two of the four slider members are fixedly connected to an inside of the first rear housing relative to each other, and the other two of the four slider members are fixedly connected to an inside of the second rear housing relative to each other;

a support plate including a first support plate and a second support plate, wherein the first support plate is disposed inside the first rear housing and fixedly connected to the corresponding slider members, and the second support plate is disposed inside the second rear housing and fixedly connected to the corresponding slider members;

a flexible display screen including a first non-bending region, a bending region, and a second non-bending region, wherein the first non-bending region and the second non-bending region are respectively attached to the first support plate and second support plate; and a front frame including a first front frame connected to a side of the first rear housing, and a second front frame connected to a side of the second rear housing, wherein the first front frame and the second front frame enclose an opening, wherein when the foldable display device is in an unfolded state, the first support plate is parallel to the first rear housing, and the second support plate is parallel to the second rear housing, and when the foldable display device is in a folded state, the first support plate is parallel to the first rear housing, and the second support plate is inclined related to the second rear housing.

In a foldable display device according to an embodiment of the present invention, when the foldable display device is in the folded state, a vertical distance from a side of the second support plate away from the bending region to the second rear housing is greater than a vertical distance from a side of the second support plate near the bending region to the second rear housing.

In a foldable display device according to an embodiment of the present invention, a connecting end of the connection member is provided with a first gear shaft part and a second gear shaft part, a connecting end of the first rear housing is provided with a first gear part, a connecting end of the second rear housing is provided with a second gear part, the first gear shaft part is penetrated in the first gear part, and the second gear shaft part is penetrated in the second gear part.

In a foldable display device according to an embodiment of the present invention, the first gear shaft part includes a first branch shaft of the first gear shaft part and a second branch shaft of the first gear shaft part respectively provided at two corresponding connecting ends of the connection member, and the second gear shaft part includes a first branch shaft of the second gear shaft part and a second branch shaft of the second gear shaft part respectively provided at two corresponding connecting ends of the connection member.

In a foldable display device according to an embodiment of the present invention, the first gear part and the second gear part are engaged with each other.

In a foldable display device according to an embodiment of the present invention, a first support platform is further provided inside the first rear housing, and a support height of the first support platform is same as a support height of the slider members.

In a foldable display device according to an embodiment of the present invention, two of the first support platforms are provided inside the first rear housing, and are respectively disposed on corresponding two sides of the first rear housing.

In a foldable display device according to an embodiment of the present invention, a side surface of the second gear shaft part is further provided with at least one second support platform, a cross-sectional shape of the at least one second support platform is rectangle, and when the foldable display device is in a fully unfolded state, a long side of the rectangle is perpendicular to the second support plate.

In a foldable display device according to an embodiment of the present invention, the second gear shaft part protrudes from an inner sidewall of the second rear housing, and the at least one second support platform is provided on a side surface of a protruding portion of the second gear shaft part.

In a foldable display device according to an embodiment of the present invention, the side surface of the second gear shaft part is further provided with two of the at least one second support platforms disposed on a side surface of the first branch shaft of the second gear shaft part and a side surface of the second branch shaft of the second gear shaft part, respectively.

In a foldable display device according to an embodiment of the present invention, a side surface of the first gear shaft part is further provided with the at least one second support platform.

In a foldable display device according to an embodiment of the present invention, when the foldable display device is in the fully unfolded state, a support height of the at least one second support platform is same as a support height of the slider members.

In a foldable display device according to an embodiment of the present invention, the second support plate is in contact with the at least one second support platform during folding the foldable display device, and rotates from being parallel to the second rear housing to be inclined related to the second rear housing under a support of the at least one second support platform.

In a foldable display device according to an embodiment of the present invention, the slider members include a spring, the first support plate and the second support plate slide in a direction away from the bending region under a pushing action of the spring during folding the foldable display device.

In a foldable display device according to an embodiment of the present invention, the foldable display device further including a battery, a system board, and a camera assembly, wherein the battery and the system board are disposed in the first rear housing and are positioned on a side of the first support plate away from the flexible display screen, the camera assembly is disposed in the second rear housing and is positioned on a side of the second support plate away from the flexible display screen.

In a foldable display device according to an embodiment of the present invention, the first front frame and the second front frame are bolted connected or snap-connected to the first rear housing and the second rear housing, respectively.

In a foldable display device according to an embodiment of the present invention, the flexible display screen is a flexible organic light-emitting diode (OLED) display panel.

Beneficial Effect

Compared with the conventional art, the present invention provides a foldable display device. In a folded state, a non-bending region of a flexible display screen exhibits a certain inclination angle with respect to a housing of the display device, to make an "excess" region of the flexible display screen after folding can be accommodated inside the device, forming a shape similar to a water drop, while another non-bending region is kept parallel to the housing of the display device to provide a larger space to accommodate a larger volume components such as system boards and batteries.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

Figure 1:
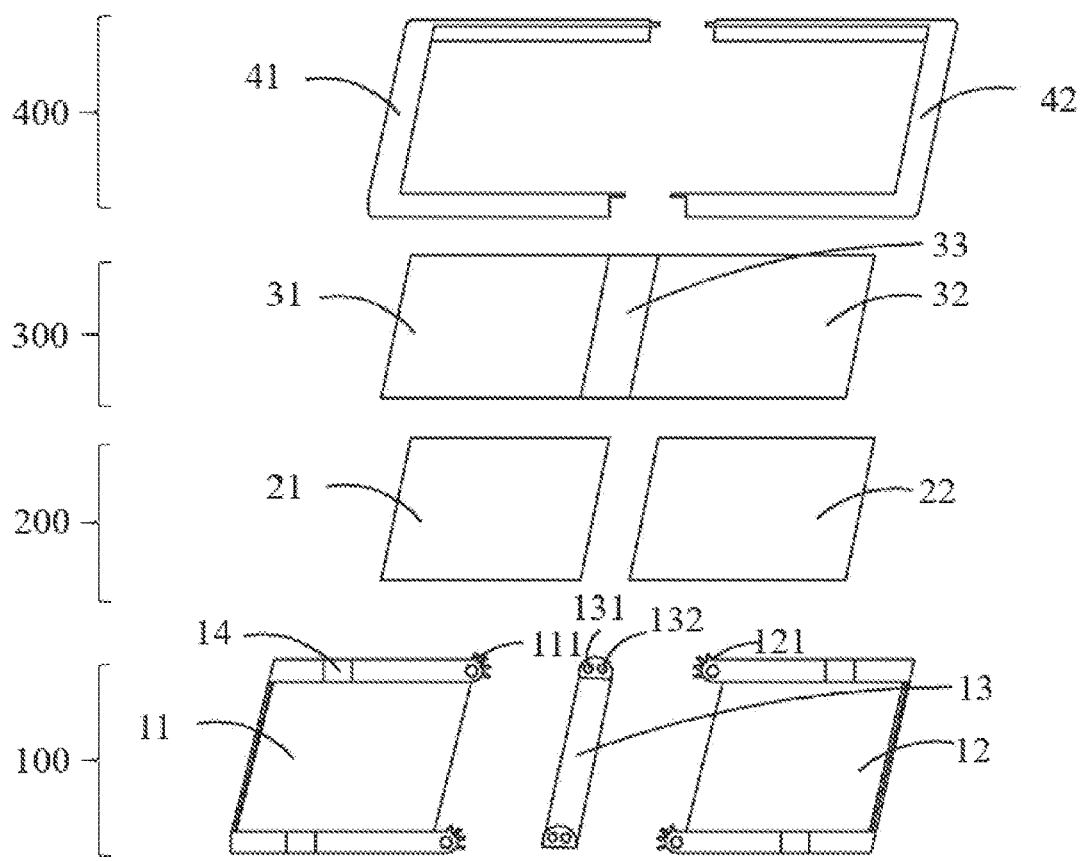
FIG. 1 is an exploded structural schematic view of a foldable display device provided by an embodiment of the present invention.

The following content combines with the drawings and the embodiment for describing the present application in detail. It is obvious that the following embodiments are merely some embodiments of the present application, but not all the embodiments. Based on the embodiments in the present application, for the skilled persons of ordinary skill in the art without creative effort, the other embodiments obtained thereby are still covered by the present application.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the present application, the term "exemplary" is used to mean "used as an example, illustration, or illustration." Any embodiment described in the present application as "exemplary" is not necessarily to be construed as being more preferred or advantageous than other embodiments. In order to enable any person skilled in the art to implement and use the present invention, the following description is given. In the following description, details are listed for explanatory purposes. It should be understood that those of ordinary skill in the art may recognize that the present invention can be implemented without using these specific details. In other instances, well-known structures and procedures will not be elaborated in detail in order to avoid unnecessary details that obscure the description of the present invention. Therefore, the present invention is not intended to be limited to the illustrated embodiments, but is consistent with the widest scope consistent with the principles and features disclosed in the present application.

Figure 2:
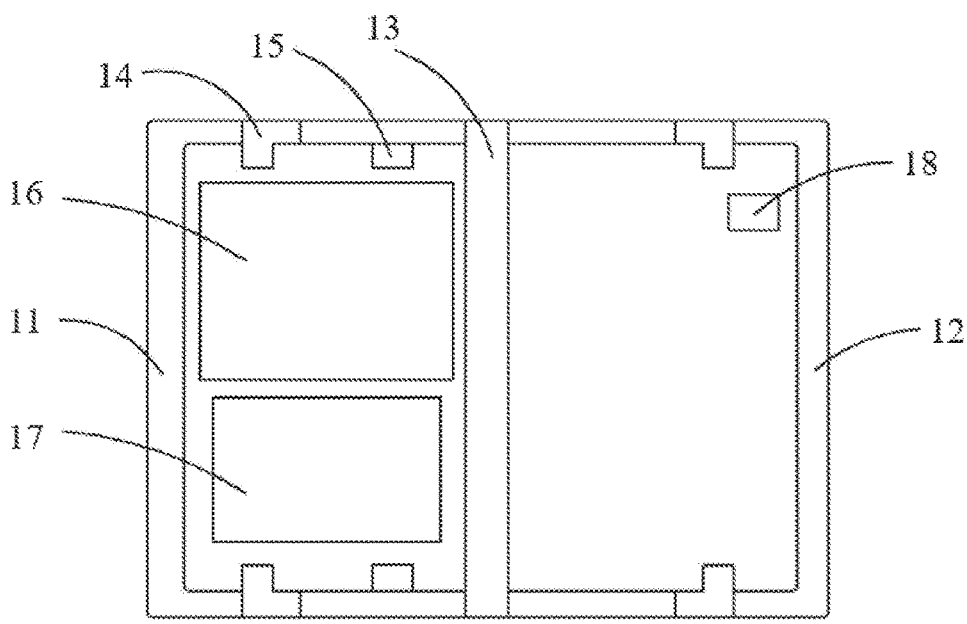
FIG. 2 is a top-down structural schematic view of the foldable display device provided by the embodiment of the present invention.
Figure 3:
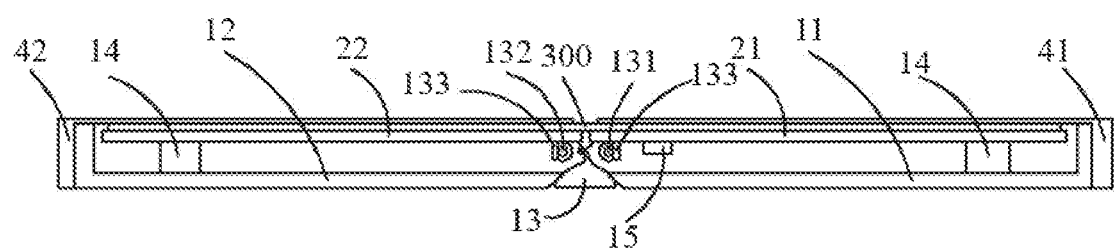
FIG. 3 is a cross-sectional structural schematic view of the foldable display device in an unfolded state provided by the embodiment of the present invention.
Figure 4:
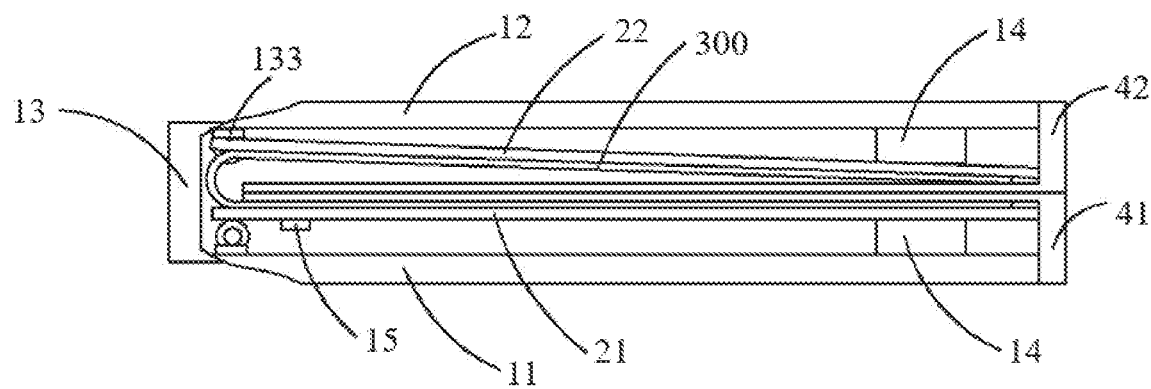
FIG. 4 is a cross-sectional structural schematic view of the foldable display device in a folded state provided by an embodiment of the present invention.

For a foldable display device provided by an embodiment of the present invention, please refer to FIGS. 1-4. FIG. 1 is an exploded structural schematic view of the foldable display device provided by an embodiment of the present invention, FIG. 2 is a top-down structural schematic view of the foldable display device provided by the embodiment of the present invention, FIG. 3 is a cross-sectional structural schematic view of the foldable display device in an unfolded state provided by the embodiment of the present invention, FIG. 4 is a cross-sectional structural schematic view of the foldable display device in a folded state provided by an embodiment of the present invention, and the details are described below.

The foldable display device includes the followings.

A bottom housing assembly 100, including:

a rear housing including a first rear housing 11 and a second rear housing 12;

a connection member 13 respectively connected to the first rear housing 11 and the second rear housing 12, wherein the first rear housing 11 and the second rear housing 12 can rotate about the connection member 13 as an axis to realize folding and unfolding of the display device; and four slider members 14, wherein two of the four slider members are fixedly connected to an inside of the first rear housing 11 relative to each other, and the other two of the four slider members are fixedly connected to an inside of the second rear housing 12 relative to each other, under general circumstances, the slider members are fixed at intersections between an inner sidewall and bottom surfaces of the first rear housing and the second rear housing.

A support plate 200 includes a first support plate 21 and a second support plate 22, wherein the first support plate 21 is disposed inside the first rear housing 11 and fixedly connected to the corresponding slider members 14, and the second support plate 22 is disposed inside the second rear housing 12 and fixedly connected to the corresponding slider members 14. During a folding process, the first support plate 21 and the second support plate 22 slide relative to each other under an action of the slider members 14.

A flexible display screen 300 includes a first non-bending region 31, a bending region 33, and a second non-bending region 32. The first non-bending region 31 and the second non-bending region 32 are respectively attached and connected to the first support plate 21 and the second support plate 22 under a support of the support plate, preventing the flexible display screen from wrinkling due to its excessive softness.

A front frame 400 is connected to the first rear housing 11 and the second rear housing 12, and the front frame includes an opening to expose the flexible display screen 300. Normally, in order to realize the folding function, the front frame 400 is a split structure, including a first front frame 41 and a second front frame 42, the first front frame 41 being connected to a side of the first rear housing 11, and the second front frame 42 being connected to a side the second rear housing 12.

The first front frame 41 and the second front frame 42 are respectively connected to the first rear housing 11 and the second rear housing 12, and a connection method can be a bolt connection, a snap connection or other commonly used connection methods.

When the foldable display device is in an unfolded state, the first support plate 21 is parallel to the first rear housing 11, and the second support plate 22 is parallel to the second rear housing 12.

When the foldable display device is in a folded state, the first support plate 21 is parallel to the first rear housing 11, where a space under the first support plate 21 in a parallel state is large and can accommodate other large-volume components required by the display device, and the second support plate 22 is in an inclined state relative to the second rear housing 12. Correspondingly, the second non-bending region 32 of the flexible display screen is also inclined with respect to the second rear housing 12. It can be understood that for a same space, an inclined state has a longer length than the parallel state, so that an "excess" region of the flexible display screen after folding can be accommodated inside the device. Generally, during bending, the second support plate 22 is inclined relative to the second rear housing 12; specifically, a vertical distance from a side of the second support plate 22 away from the bending region 33 to the second rear housing 12 is greater than a vertical distance from a side of the second support plate 22 near the bending region 33 to the second rear housing 12.

In an embodiment, a connecting end of the connection member 13 is provided with a first gear shaft part 131 and a second gear shaft part 132, a connecting end of the first rear housing 11 is provided with a first gear part 111, a connecting end of the second rear housing 12 is provided with a second gear part 121, the first gear shaft part 131 penetrates into the first gear part 111, and the second gear shaft part 132 penetrates into the second gear part 121, thereby allowing the first rear housing 11 to pivot around the first gear shaft part 131 and the second rear housing 12 to pivot around the second gear shaft part 132.

Specifically, the first gear shaft part 131 includes a first branch shaft of the first gear shaft part and a second branch shaft of the first gear shaft part that are respectively provided at two corresponding connecting ends of the connection member 13. Similarly, the second gear shaft part 132 includes a first branch shaft of the second gear shaft part and a second branch shaft of the second gear shaft part respectively provided at two corresponding connecting ends of the connection member 13.

In an embodiment, the first gear part and the second gear part are engaged with each other to realize linked rotation.

In an embodiment, two first support platforms 15 are further provided inside the first rear housing 11, and are oppositely disposed on the inner sidewalls of the first rear housing 11, and a support height of the first support platforms 15 is same as a support height of the slider members 14, that is, regardless of the state of the foldable display device, the first support plate 21 and the first rear housing 11 are in the parallel state.

In an embodiment, the second gear shaft part 132 protrudes from the inner sidewall of the second rear housing 12. Two of the second support platforms 133 are provided on a side surface of each a protruding portion of the second gear shaft part 132, and are disposed on a side surface of the first branch shaft of the second gear shaft part and a side surface of the second branch shaft of the second gear shaft part, respectively. A cross-sectional shape of the second support platform 133 is rectangular, and when the foldable display device is in a fully unfolded state, a long side of the rectangular shape is perpendicular to the second support plate 22. At this time, a support height of the second support platforms 133 is the same as a support height of the slider members 14, and the second support plate 22 is in the parallel state relative to the second rear housing 12. During the folding of the display device, due to the stiffness of the flexible display screen, the second support plate 22 stays in contact with the second support platform 133. As a rotation angle changes, a contact position between the second support plate 22 and the second support platform 133 changes. Specifically, from the cross-sectional structure analysis, in an initial state, the long side of the rectangle of the second support platform 133 is perpendicular to the second support plate 22, and as a folding angle becomes larger and larger, the long side of the rectangle begins to incline towards the second support plate 22 until the long side of the rectangle is parallel to the second support plate 22 when fully folded. That is, as the folding angle becomes larger, the support height of the second support platform 133 becomes smaller and smaller, so an inclination angle of the second support plate 22 relative to the second rear housing 12 becomes larger and larger; that is, an inclination angle of the second display panel relative to the second rear housing becomes larger and larger. It can be understood that the cross-sectional shape of the second support platform is not limited to a rectangle. Theoretically, as long as the height of the second support platform in the vertical direction is greater than a width thereof in the horizontal direction in the unfolded state, it is possible to make the support height of the second support platform gradually decrease during the folding process, so that the second support plate gradually rotates from being parallel to the second rear housing into an inclined state relative to the second rear housing.

Furthermore, a manner in which the second support plate tilts during rotation is not limited to the specifically-shaped above-mentioned support platform provided on the gear shaft part, other structures that can achieve this function can also be used. For example, a support platform provided below the second support platform that can be automatically raised and lowered, and is adjustable during the folding process so that the support platform is lifted to a required support height, is of course possible, other methods are also possible, and the present embodiment is not specific limited here.

In an embodiment, the first gear shaft part 131 is also provided with the second support platform 133 as the foregoing manner, which serves as a further auxiliary support function. However, due to an arrangement of the first support platform 15, regardless of whether the foldable is in any state of the display device, the first support plate 21 is parallel to the first rear housing 11.

In an embodiment, the slider members 14 include a spring. During the folding process of the foldable display device, the first support plate 21 and the second support plate 22 are slid in a direction away from the bending region under an urging action of the spring to provide a bending space for the bending region 33 of the flexible display screen 300.

In an embodiment, the foldable display device further includes a battery 17, a system motherboard 16, and a camera assembly 18. The battery 17 and the system motherboard 16 are disposed in the first rear housing 11 due to their larger volume, and are positioned on a side of the first support plate 21 away from the flexible display screen 300. The camera assembly 18 is positioned in the second rear housing 12 due to its smaller volume, and is positioned on the side of the second support plate 22 away from the flexible display 300.

In an embodiment, the flexible display screen is a flexible organic light-emitting diode (OLED) display panel.

In the above embodiments, the description of each embodiment has its own emphasis. For a part that is not detailed in an embodiment, it can be refer to the above detailed description for other embodiments, and details are not described here.

In a specific implementation, the above units or structures can be implemented as independent entities, or they can be combined in any combination as one or several entities. For the specific implementation of the above units or structures, please refer to the previous manner in the embodiments, which will not repeat here again.

The foldable display device provided by the embodiments of the present invention has been described in detail above. The present document uses specific embodiments to explain principles and implementation of the application. Descriptions of above embodiments are only used to help understand technical solutions and core ideas of the application. A person skilled in the art can make various modifications and changes to the above embodiments without departing from the technical idea of the present invention, and such variations and modifications are intended to be within the scope of the invention.

What is claimed is:

1. A foldable display device, comprising:
  a rear housing comprising a first rear housing and a second rear housing;
  a connection member connected to the first rear housing and the second rear housing, wherein the first rear housing and the second rear housing are connected by the connection member, and the first rear housing and the second rear housing rotate about the connection member as an axis;
  four slider members, wherein two of the four slider members are fixedly connected to an inside of the first rear housing relative to each other, and the other two of the four slider members are fixedly connected to an inside of the second rear housing relative to each other;
  a support plate comprising a first support plate and a second support plate, wherein the first support plate is disposed inside the first rear housing and fixedly connected to the corresponding slider members, and the second support plate is disposed inside the second rear housing and fixedly connected to the corresponding slider members;
  a flexible display screen comprising a first non-bending region, a bending region, and a second non-bending region, wherein the first non-bending region and the second non-bending region are respectively attached to the first support plate and second support plate; and
  a front frame comprising a first front frame connected to a side of the first rear housing, and a second front frame connected to a side of the second rear housing, wherein the first front frame and the second front frame enclose an opening;
  wherein when the foldable display device is in an unfolded state, the first support plate is parallel to the first rear housing, and the second support plate is parallel to the second rear housing, and
  when the foldable display device is in a folded state, the first support plate is parallel to the first rear housing, and the second support plate is inclined related to the second rear housing.

2. The foldable display device according to claim 1, wherein when the foldable display device is in the folded state, a vertical distance from a side of the second support plate away from the bending region to the second rear housing is greater than a vertical distance from a side of the second support plate near the bending region to the second rear housing.

3. The foldable display device according to claim 1, wherein a connecting end of the connection member is provided with a first gear shaft part and a second gear shaft part, a connecting end of the first rear housing is provided with a first gear part, a connecting end of the second rear housing is provided with a second gear part, the first gear shaft part penetrates into the first gear part, and the second gear shaft part penetrates into the second gear part.

4. The foldable display device according to claim 3, wherein the first gear shaft part comprises a first branch shaft of the first gear shaft part and a second branch shaft of the first gear shaft part, respectively provided at two corresponding connecting ends of the connection member, and the second gear shaft part comprises a first branch shaft of the second gear shaft part and a second branch shaft of the second gear shaft part respectively provided at the two corresponding connecting ends of the connection member.

5. The foldable display device according to claim 3, wherein the first gear part and the second gear part are engaged with each other.

6. The foldable display device according to claim 1, wherein at least one first support platform is further provided inside the first rear housing, and a support height of the at least one first support platform is same as a support height of the slider members.

7. The foldable display device according to claim 6, wherein two of the at least one first support platforms are provided inside the first rear housing, and are respectively disposed correspondingly on two sides of the first rear housing.

8. The foldable display device according to claim 4, wherein a side surface of the second gear shaft part is further provided with at least one second support platform, a cross-sectional shape of the at least one second support platform is rectangular, and when the foldable display device is in a fully unfolded state, a long side of the rectangular shape is perpendicular to the second support plate.

9. The foldable display device according to claim 8, wherein the second gear shaft part protrudes from an inner sidewall of the second rear housing, and the at least one second support platform is provided on a side surface of a protruding portion of the second gear shaft part.

10. The foldable display device according to claim 8, wherein the side surface of the second gear shaft part is further provided with two of the at least one second support platforms disposed on a side surface of the first branch shaft of the second gear shaft part and a side surface of the second branch shaft of the second gear shaft part, respectively.

11. The foldable display device according to claim 8, wherein a side surface of the first gear shaft part is further provided with the at least one second support platform.

12. The foldable display device according to claim 8, wherein when the foldable display device is in the fully unfolded state, a support height of the at least one second support platform is same as a support height of the slider members.

13. The foldable display device according to claim 8, wherein the second support plate is in contact with the at least one second support platform during folding the foldable display device, and rotates from being parallel to the second rear housing into an inclined state relative to the second rear housing under a support of the at least one second support platform.

14. The foldable display device according to claim 1, wherein the slider members comprise a spring, the first support plate and the second support plate slide in a direction away from the bending region under a pushing action of the spring during folding the foldable display device.

15. The foldable display device according to claim 1, further comprising a battery, a system motherboard, and a camera assembly, wherein the battery and the system board are disposed in the first rear housing and are positioned on a side of the first support plate away from the flexible display screen, the camera assembly is disposed in the second rear housing and is positioned on a side of the second support plate away from the flexible display screen.

16. The foldable display device according to claim 1, wherein the first front frame and the second front frame are bolted connected or snap-connected to the first rear housing and the second rear housing, respectively.

17. The foldable display device according to claim 1, wherein the flexible display screen is a flexible organic light-emitting diode (OLED) display panel.

* * * * *

UNITED STATES PATENT AND TRADEMARK OFFICE
CERTIFICATE OF CORRECTION

PATENT NO. : 11,181,942 B1
APPLICATION NO. : 16/965646
DATED : November 23, 2021
INVENTOR(S) : Zikang Feng It is certified that error appears in the above-identified patent and that said Letters Patent is hereby corrected as shown below:

On the Title Page

Insert the following:
--*(30) Foreign Application Priority Data*
Jun. 22, 2020 (CN)..............................202010573541.9--

Signed and Sealed this
Thirtieth Day of August, 2022

Katherine Kelly Vidal
*Director of the United States Patent and Trademark Office*